US009257556B2

(12) United States Patent
Xu et al.

(10) Patent No.: US 9,257,556 B2
(45) Date of Patent: Feb. 9, 2016

(54) SILICON GERMANIUM FINFET FORMATION BY GE CONDENSATION

(71) Applicant: QUALCOMM Incorporated, San Diego, CA (US)

(72) Inventors: Jeffrey Junhao Xu, San Diego, CA (US); Vladimir Machkaoutsan, Leuven (BE); Kern Rim, San Diego, CA (US); Stanley Seungchul Song, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/269,981

(22) Filed: May 5, 2014

(65) Prior Publication Data
US 2015/0194525 A1    Jul. 9, 2015

Related U.S. Application Data

(60) Provisional application No. 61/923,489, filed on Jan. 3, 2014.

(51) Int. Cl.
H01L 29/66 (2006.01)
H01L 29/78 (2006.01)
H01L 29/10 (2006.01)

(52) U.S. Cl.
CPC ........ *H01L 29/7848* (2013.01); *H01L 29/1054* (2013.01); *H01L 29/66795* (2013.01); *H01L 29/785* (2013.01); *H01L 29/7847* (2013.01); *H01L 29/7851* (2013.01)

(58) Field of Classification Search
CPC ............... H01L 21/823431; H01L 21/823821; H01L 29/41791; H01L 29/66795; H01L 27/0886; H01L 29/7848; H01L 29/1054
USPC ................................... 257/192, 401; 438/285
See application file for complete search history.

(56) References Cited

U.S. PATENT DOCUMENTS

| 7,993,999 | B2 | 8/2011 | Basker et al. |
| 8,211,772 | B2 | 7/2012 | Kavalieros et al. |
| 8,497,177 | B1 | 7/2013 | Chang et al. |
| 8,957,476 | B2 * | 2/2015 | Glass et al. ............ 257/337 |
| 2007/0221956 | A1 | 9/2007 | Inaba |
| 2008/0003725 | A1 | 1/2008 | Orlowski et al. |

(Continued)

FOREIGN PATENT DOCUMENTS

| EP | 1519420 A2 | 3/2005 |
| WO | 2011054776 A1 | 5/2011 |
| WO | 2014099013 A1 | 6/2014 |

OTHER PUBLICATIONS

International Search Report and Written Opinion—PCT/US2014/070579—ISA/EPO—Mar. 4, 2015.

*Primary Examiner* — Tu-Tu Ho
(74) *Attorney, Agent, or Firm* — Seyfarth Shaw LLP

(57) ABSTRACT

A method of forming a semiconductor fin of a FinFET device includes conformally depositing an amorphous or polycrystalline thin film of silicon-germanium (SiGe) on the semiconductor fin. The method also includes oxidizing the amorphous or polycrystalline thin film to diffuse germanium from the amorphous or polycrystalline thin film into the semiconductor fin. Such a method further includes removing an oxidized portion of the amorphous or polycrystalline thin film.

26 Claims, 11 Drawing Sheets

(56) References Cited

U.S. PATENT DOCUMENTS

| | | |
|---|---|---|
| 2010/0264468 A1 | 10/2010 | Xu |
| 2011/0024804 A1 | 2/2011 | Chang et al. |
| 2011/0193178 A1 | 8/2011 | Chang et al. |
| 2011/0260250 A1* | 10/2011 | Miller et al. .................. 257/347 |
| 2014/0175543 A1* | 6/2014 | Glass et al. .................... 257/337 |
| 2015/0054121 A1* | 2/2015 | He et al. ........................ 257/506 |

* cited by examiner

US 9,257,556 B2

SILICON GERMANIUM FINFET FORMATION BY GE CONDENSATION

CROSS REFERENCE TO RELATED APPLICATION

The present disclosure claims the benefit of U.S. provisional patent application No. 61/923,489, entitled "SILICON GERMANIUM FINFET FORMATION BY GE CONDENSATION," filed on Jan. 3, 2014, the disclosure of which is expressly incorporated by reference herein in its entirety.

BACKGROUND

1. Field

Aspects of the present disclosure relate to semiconductor devices, and more particularly to silicon germanium (SiGe) use in fin-type field-effect transistors (FinFETs).

2. Background

Silicon germanium (SiGe) has been widely reviewed as a promising material for p-channel metal-oxide-semiconductor (PMOS) devices. SiGe has an intrinsically higher hole mobility than silicon. In standard field effect transistor (FET) geometries, imparting a strain in semiconductor chip regions, such as the source and drain regions of a FET, is common. In fin-type field-effect transistors (FinFETs) structures, however, the volume of the fin available for strain engineering is small. As fin geometries are reduced, such as in ten (10) nanometer device designs, fabrication of SiGe fins becomes expensive and difficult to achieve.

SUMMARY

A method of forming a semiconductor fin of a FinFET device may include conformally depositing an amorphous or polycrystalline thin film of silicon-germanium (SiGe) on the semiconductor fin. The method also includes oxidizing the amorphous or polycrystalline thin film to diffuse germanium from the amorphous or polycrystalline thin film into the semiconductor fin. Such a method further includes removing an oxidized portion of the amorphous or polycrystalline thin film.

A fin-type field-effect transistor (FinFET) device on a substrate includes a semiconductor fin. The semiconductor fin may be comprised of a conformally deposited amorphous or polycrystalline silicon-germanium (SiGe) thin film. The germanium from the amorphous or polycrystalline silicon-germanium (SiGe) thin film may be diffused into the semiconductor fin.

An FinFET device on a substrate includes means for conducting current. The current conducting means may be comprised of a conformally deposited amorphous or polycrystalline silicon-germanium (SiGe) thin film. The germanium from the amorphous or polycrystalline silicon-germanium (SiGe) thin film may be diffused into the semiconductor fin.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
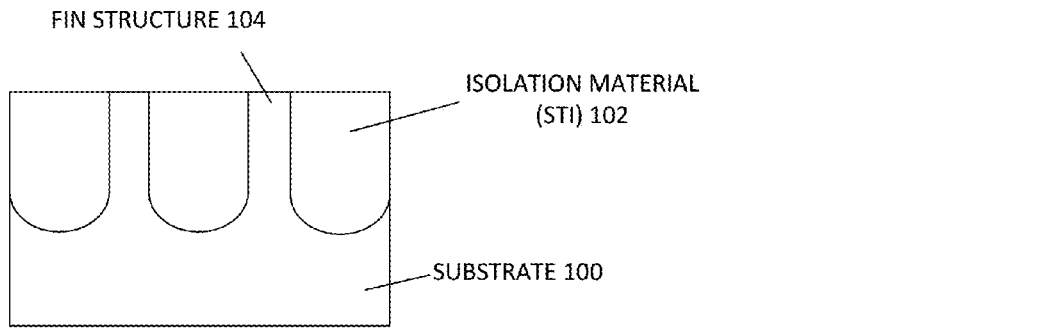
FIGS. 1A-1D illustrate side views of a FinFET semiconductor device.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A high mobility conduction channel is desirable for high performance transistors. Material selection and strain engineering are design features that alter the mobility of charge carriers in the channel of transistors. In metal-oxide-semiconductor (MOS) field effect transistors (MOSFETs), strain engineering is used, but in fin-based structures (FinFETs), the use of strained materials is challenging. There are more free surfaces in FinFET structures, and the source/drain volume available for strain engineering is small compared to other FET geometries and techniques.

Silicon germanium (SiGe) is considered as a leading candidate for ten (10) nanometer and smaller p-channel metal-oxide-semiconductor (PMOS) devices. SiGe fin formation may include an etch or recess of a silicon (Si) fin, followed by an epitaxial growth of SiGe in the recess. A chemical-mechanical planarization (CMP) process may be used to remove overgrown SiGe on the shallow trench isolation (STI) material to form a SiGe fin. The cost of this process is high, resulting in high cost FinFET devices.

Further, although a SiGe fin grown on a silicon template often possesses uniaxial compressive stress along the fin length, epitaxial growth of the SiGe fin involves a thermal anneal process at temperatures exceeding 900 degrees Centigrade (C). The thermal anneal process is performed at a high temperature (e.g., 900° C.) to enable curing of epitaxial growth defects. This thermal anneal process, however, may relax the uniaxial stress in the SiGe fin, which may reduce the hole mobility in the SiGe channel.

Some described implementations relate to fin-type field-effect transistors (FinFETs). FinFETs are double-gate devices. The two gates of a FinFET may be shorted for higher performance or independently controlled for lower leakage or reduced transistor count. These FinFET features enable an improved design space. These features also enable the use of FinFET devices in place of bulk complementary metal-oxide-semiconductor (CMOS) devices at the nanoscale. In one configuration, a semiconductor fin comprises a conformally deposited amorphous or polycrystalline silicon-germanium (SiGe) thin film. In this configuration, the germanium from the amorphous or polycrystalline silicon-germanium (SiGe) thin film is diffused into the semiconductor fin. In some implementations, a silicon germanium (SiGe) FinFET device is described. A compressive strain in the semiconductor fin may be greater than in the substrate supporting the semiconductor fin. In one configuration, the semiconductor fin is substantially in a same crystal orientation as a surface of the substrate. In another configuration, a FinFET device includes a SiGe spacer on the semiconductor fin.

Various aspects of the disclosure provide techniques for fabricating a semiconductor fin of a FinFET device. It will be understood that the term "layer" includes film and is not to be construed as indicating a vertical or horizontal thickness unless otherwise stated. As described herein, the term "semiconductor substrate" may refer to a substrate of a diced wafer or may refer to the substrate of a wafer that is not diced. Similarly, the terms wafer and die may be used interchangeably unless such interchanging would tax credulity.

FIGS. 1A-1D illustrate side views of a FinFET semiconductor device. FIG. 1A shows a substrate 100, an isolation material 102, and fin structures 104. The substrate 100 may be a semiconductor material, such as silicon (e.g., a silicon wafer). The isolation material 102 may be a shallow trench isolation (STI) material, such as silicon oxide or silicon nitride, or other like materials. The fin structures 104 may be crystalline, and may be a part of a single crystal structure along with the substrate 100.

Figure 1B:
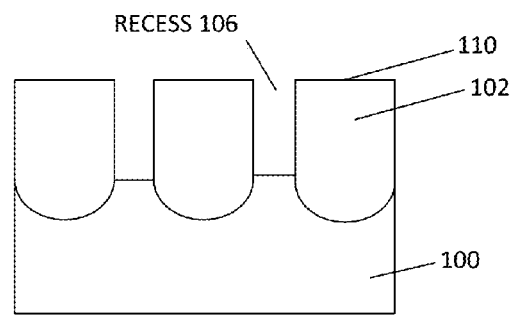
Figure 1C:
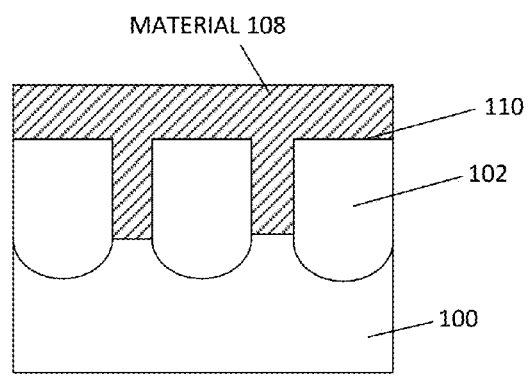

In related art approaches, the fin structures 104 are etched or otherwise removed to create recesses 106 as shown in FIG. 1B. The isolation material 102 serves as the form for the recesses 106. In FIG. 1C, a material 108 is grown within the recesses 106, and may be grown over a surface 110 of the isolation material 102. The overgrowth of the material 108 is removed via etching or polishing (e.g., CMP), to create the fin structure 112 shown in FIG. 1D. The material 108 may be SiGe. When the material 108 is SiGe, the growth across the substrate 100 and in the recesses 106 is of a uniform percentage of germanium, which limits the number of voltage thresholds of the devices on the substrate 100 using the material 108. Further, an interface 114 may have an abrupt boundary, which may limit the minimum size of the fin structure 112.

Figure 1D:
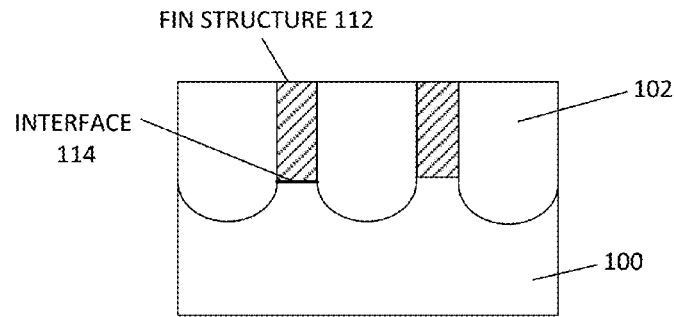

Once the fin structures 104 are formed, as shown in FIG. 1D, the fin structures 104 are annealed to reduce growth defects within the fin structures 104. This annealing may take place at elevated temperatures, such as temperatures over 900 degrees Centigrade, which may relax the compressive strain along the length of the fin structure 112. Reducing or relaxing the compressive strain along the fin structure 112 reduces the carrier mobility in the fin structure 112, and the advantages of using the material 108 in the fin structure 112 are reduced as a result.

Figure 2:
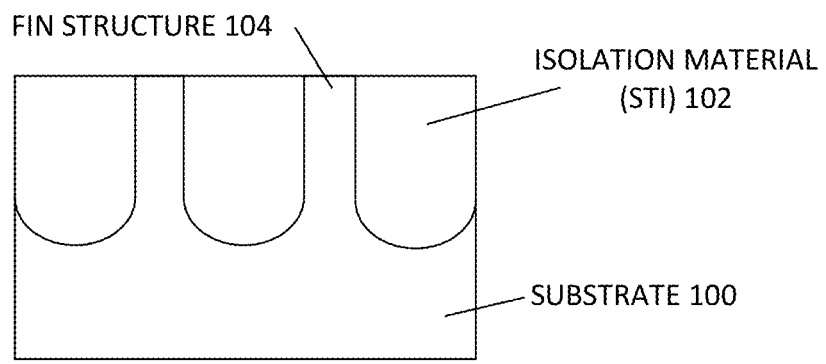
FIGS. 2 through 6 illustrate side views of a FinFET semiconductor device.
Figure 3:
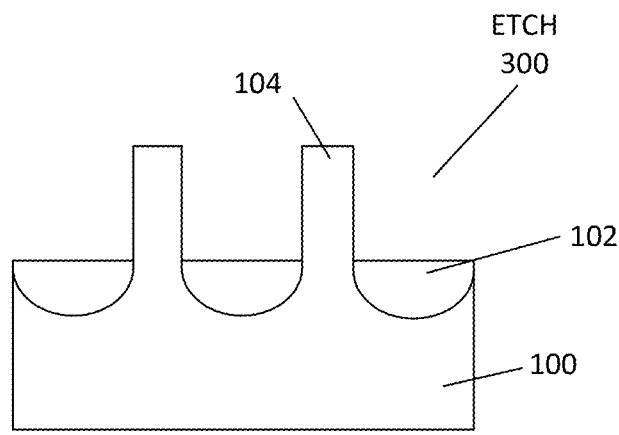

FIGS. 2 through 7 illustrate side views of a FinFET semiconductor device in accordance with one or more aspects of the present disclosure. FIG. 2 illustrates the fin structures 104, as single crystal structures formed as part of the substrate 100, with the isolation material 102 between the fin structures 104. FIG. 3 illustrates an etch 300, which etches the isolation material 102 instead of etching or removing the fin structures 104, as shown in FIG. 1B. The etch 300 may be performed using a hydrofluoric acid (HF) etch, or may be performed using a chemical wet/vapor etch (CWE) process using other etchants. The fin structures 104 may be of a first crystalline orientation, such as Miller Index (110), whereas the substrate 100 may be a second crystalline orientation, such as a (100) orientation.

Figure 4:
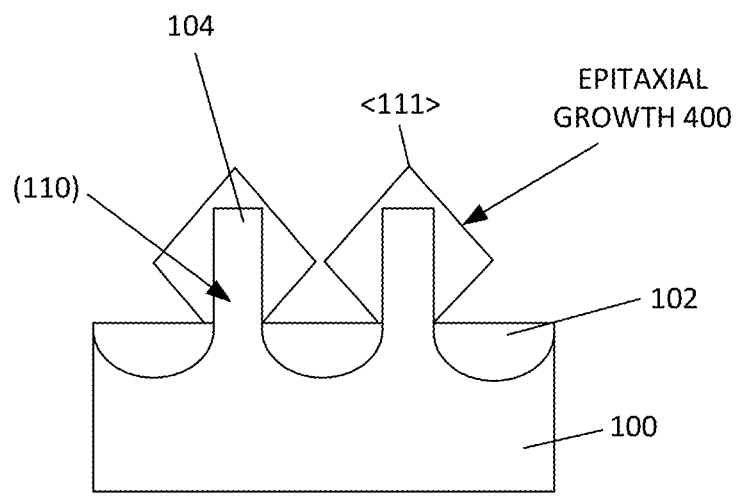

FIG. 4 illustrates an epitaxial growth 400 of silicon germanium on the fin structures 104. The epitaxial growth 400 grows on the fin structures 104 and ends up growing in another crystal orientation, such as the <111> orientation shown in FIG. 4, which is undesirable for the fin structures 104. The different crystal orientation of the epitaxial growth 400 changes the strain, which may be a compressive strain, in the fin structures 104.

Figure 5:
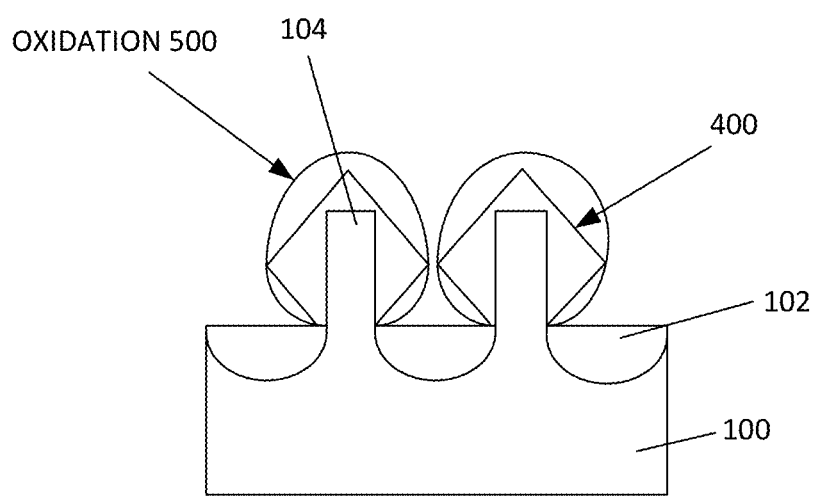

FIG. 5 illustrates an oxidation 500 of the epitaxial growth 400. The oxidation 500, which may be a dry or wet oxidation, selectively oxidizes the silicon-germanium. The silicon in the silicon germanium epitaxial growth is oxidized, while the germanium is driven into the fin structures 104.

Figure 6:
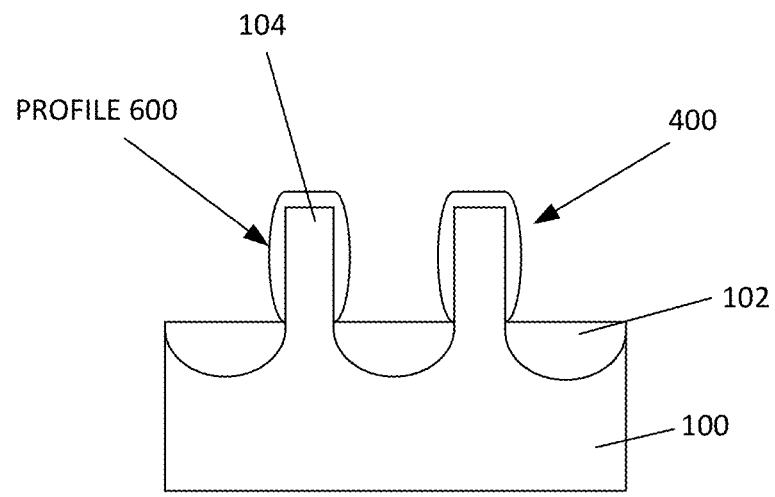

FIG. 6 illustrates a fin structure of the related art. After the oxidation 500, the oxide is removed from the fin structures 104. Because of the oxidation 500 and/or the epitaxial growth 400, however, the etching of the oxidized structure leaves a profile 600 that may be somewhat different than the fin structures 104. Further, the amount of the germanium, as well as the dopant density of the germanium, within the profile 600, may not be uniform and may not be completely desirable for the devices in which the profile 600 is used.

Figure 7:
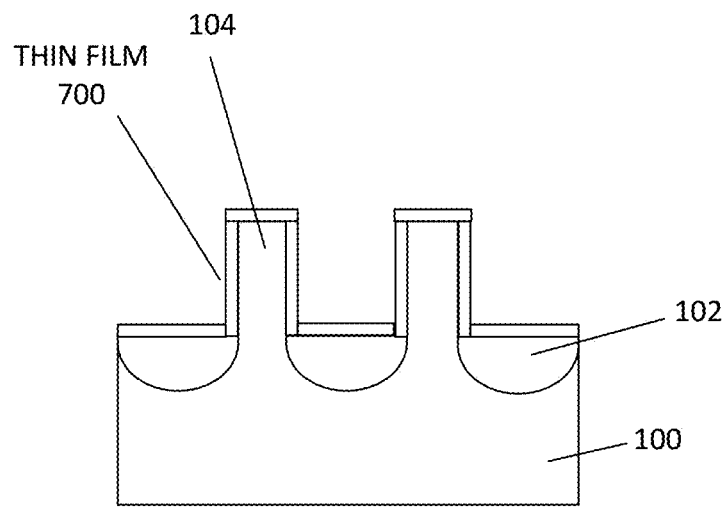
FIG. 7 illustrates a side view of a fin structure of a FinFET semiconductor device according to one aspect of the present disclosure.

FIG. 7 illustrates a fin structure of a FinFET device according to one aspect of the present disclosure. A thin film 700, which may be a conformal thin film, is deposited or otherwise coupled to the fin structures 104. Deposition of the thin film 700 may be performed in a selective or non-selective manner. The fin structures 104 may be silicon, or may be silicon-germanium, and may also be single crystal structures. The fin structures may also have a similar crystal structure to the substrate 100. In an aspect of the present disclosure, the thin film 700 may be a polycrystalline or amorphous silicon-germanium thin film. The thin film 700 may be deposited using chemical vapor deposition (CVD), plasma doping, or other methods without departing from the scope of the present disclosure.

Figure 8:
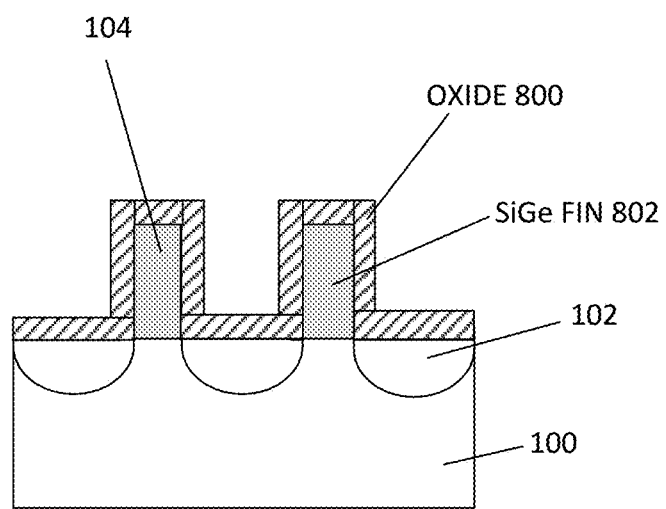
FIG. 8 illustrates a side view of the fin structure of the FinFET semiconductor device of FIG. 7 according to one aspect of the present disclosure.

FIG. 8 illustrates processing of the fin structure in an aspect of the present disclosure. An oxide 800 is formed. The oxide selectively removes the silicon from the thin film 700, while driving the germanium portion of the silicon-germanium into the fin structures 104 to create a SiGe fin 802. The amount of the desired materials (e.g., germanium) can be controlled for various ones of the fin structures 104 to control the percentage of dopant atoms in each of the SiGe fins 802. The control may be achieved through a thickness of the thin film 700 that is deposited on the fin structures 104, as well as through the time and/or temperature used to create the oxide 800.

Figure 9:
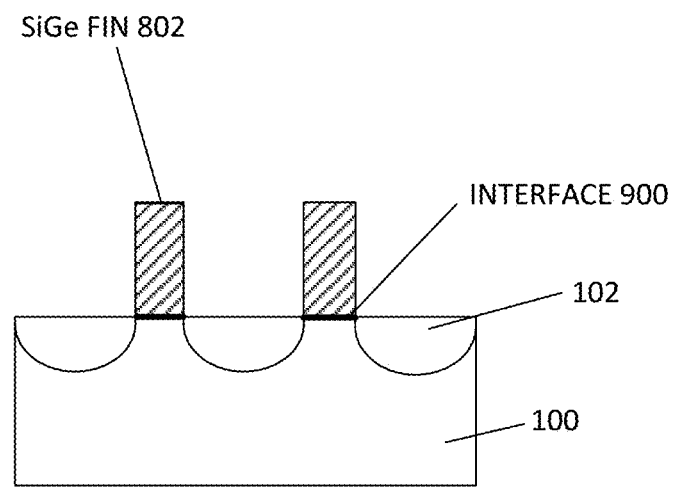
FIG. 9 illustrates a side view of the fin structure of the FinFET semiconductor device of FIG. 8 according to one aspect of the present disclosure.

FIG. 9 illustrates a side view of the fin structure of the FinFET semiconductor device of FIG. 8 according to one aspect of the present disclosure. Representatively, the SiGe fin 802 is shown after the oxide 800 is removed. The vertical walls of the SiGe fin 802 provide a more desirable shape than the profile 600. In addition, because the amount and drive of the germanium into the SiGe structure is more controlled than that described with respect to FIGS. 2-6, the channels in the SiGe fin 802 may have higher performance than fins with the profile 600.

Further, an interface 900, because it was formed from a single crystal structure emanating from the substrate 100, is less abrupt than the interface 114 shown with respect to FIGS. 1A-1D, and less abrupt than an interface generated in the devices of FIGS. 2-6. The gradient or gradual diffusion of the germanium into the SiGe fin 802 also allows germanium to diffuse into the substrate 100 below the SiGe fin 802. In this configuration, the diffusion of germanium into the substrate 100 below the SiGe fin 802 reduces the strain on the interface 900 between the substrate 100 and the SiGe fin 802. This allows for additional strain within the SiGe fin 802 without unduly straining the interface 900.

In an aspect of the present disclosure, the SiGe fin 802 is self-aligned to the fin structure 104. Further, as described above, the concentration of dopant material (e.g., germanium) in the SiGe fin 802 can be controlled using different doses of dopant material in the thin film 700. As such, multiple dopant concentrations for different type of devices on the same substrate 100 can be realized in an aspect of the present disclosure. Further, one aspect of the present disclosure provides a final fin structure that is less expensive to produce than that of conventional SiGe FinFETs using epitaxial growth.

Figure 10:
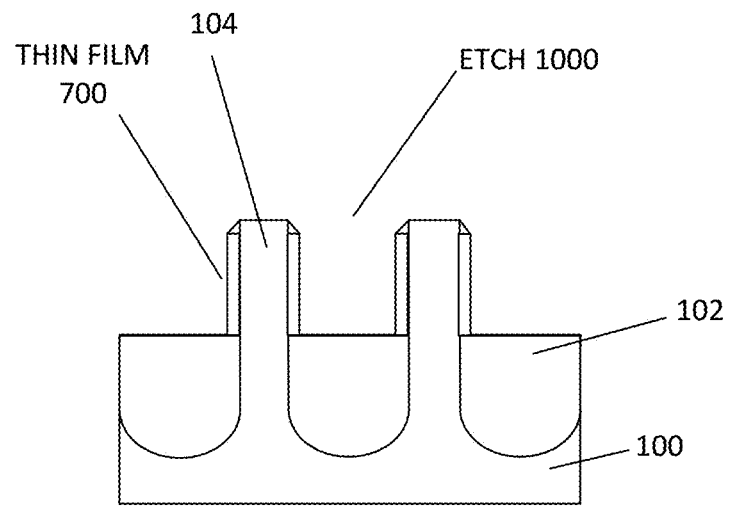
FIGS. 10 and 11 illustrate side views of a fin structure of a FinFET semiconductor device according to another aspect of the present disclosure.
Figure 11:
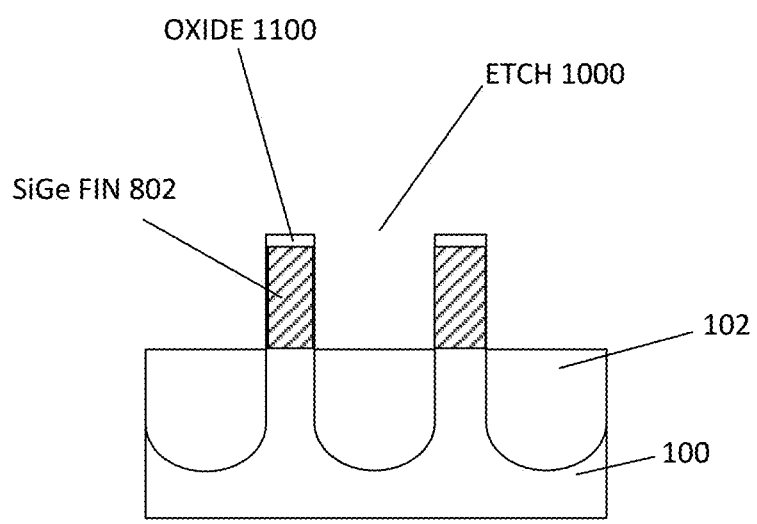

FIGS. 10 and 11 illustrate side views of a fin structures 104 of a FinFET semiconductor device according to another aspect of the present disclosure. In FIG. 10, an etch 1000 may be performed on the thin film 700 beginning from the structure shown in FIG. 7. The etch 1000 may be an anisotropic etch, and as such the thin film 700 remains on the sides of the fin structures 104. The oxidation of FIG. 8, when performed on the structure of FIG. 10, then drives the germanium from the thin film only from the sides. Because there is no germanium on the top of the fin structures 104 in this aspect of the present disclosure, the SiGe fin 802 will either have oxidized silicon on the exposed portion of the SiGe fin 802, or the SiGe fin 802 will be shorter (a smaller distance from the substrate 100) than the fin structures 104. An oxide 1100 and the SiGe fin 802, as formed in this aspect of the present disclosure, are shown in FIG. 11. The oxide 1100 may be removed by etching, chemical wet polishing, or other methods if desired.

Figure 12A:
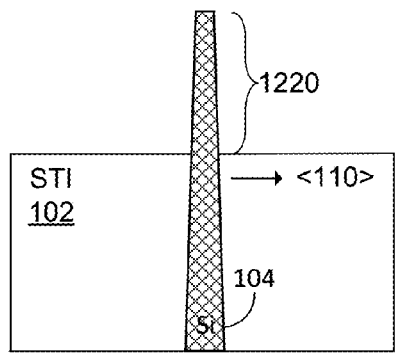
FIGS. 12A-12E illustrate side views of a fin structure of a FinFET semiconductor device according to a further aspect of the present disclosure.
Figure 12B:
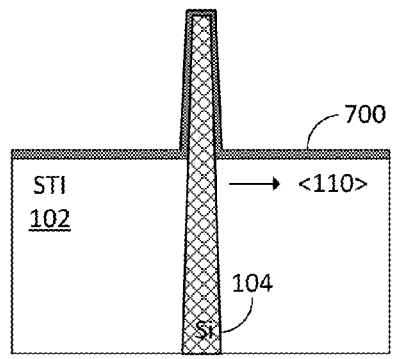
Figure 12C:
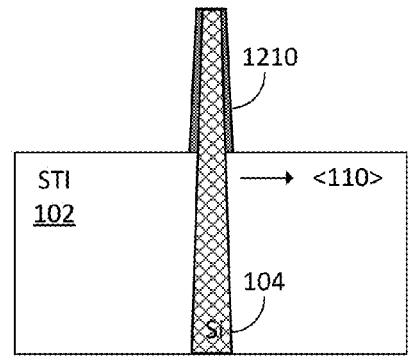
Figure 12D:
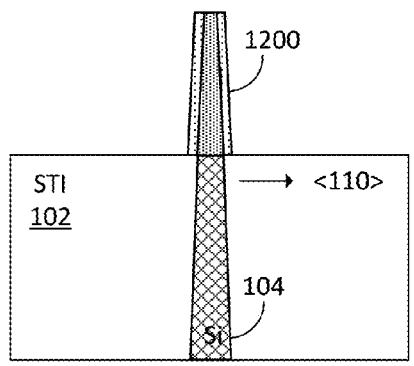
Figure 12E:
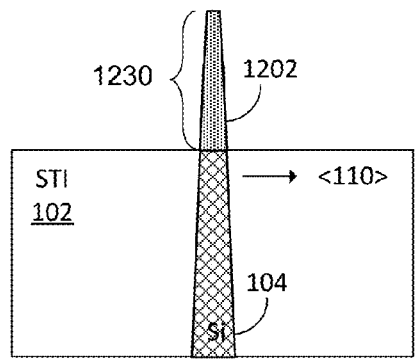

FIGS. 12A-12E illustrate side views of a fin structure 104 of a FinFET semiconductor device according to a further aspect of the present disclosure. FIG. 12A shows the incoming FinFET semiconductor device including a fin structure 104 following a recess etch of a shallow trench isolation region (STI) 102. In this configuration, the fin structure 104 (e.g., silicon) extends from and through the STI 102. The fin structure 104 is shown in a first crystalline orientation (e.g., Miller Index (110)). In this arrangement, a length 1220 of the fin structure 104 extending from the STI 102 may be longer than a length 1230 of a final fin structure 1202, as shown in FIG. 12E.

FIG. 12B shows the FinFET semiconductor device following a conformal deposition of a thin film 700 on the STI 102 and the fin structure 104 extending from the STI 102. In this aspect of the present disclosure, the thin film 700 may be a polycrystalline or amorphous silicon-germanium thin film. The thin film 700 may be deposited using chemical vapor deposition (CVD), plasma doping, or other methods without departing from the scope of the present disclosure.

FIG. 12C shows the FinFET semiconductor device following etching of the thin film 700 from the surface of the STI 102. Etching of the thin film 700 from the STI 102 and a portion of the fin structure 104 forms a spacer 1210 of the thin film 700 (e.g. silicon-germanium). In FIG. 12D, wet and dry oxidation of the spacer 1210 may be performed to selectively oxidize to form an oxide 1200 on the fin structure 104 and drive the thin film 700 into the fin structure. In FIG. 12E the oxide is removed to complete formation of the final fin structure 1202. For example, when the thin film 700 is comprised of silicon-germanium, the germanium is driven into the fin structure 104 extending from the STI 102 to form a silicon-germanium fin.

Figure 13:
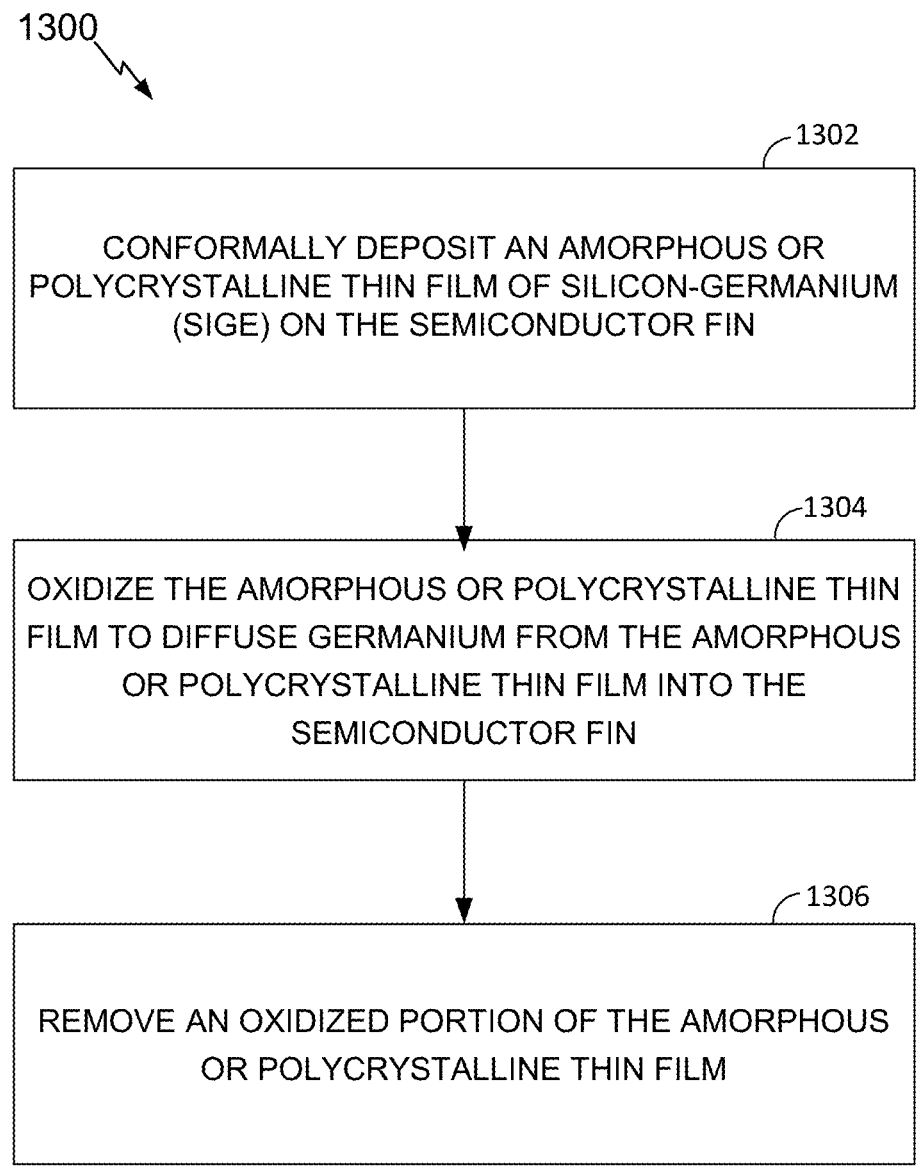
FIG. 13 is a process flow diagram illustrating a method for fabricating a silicon-germanium (SiGe) fin in a fin field effect transistor (FinFET) according to an aspect of the present disclosure.

FIG. 13 is a process flow diagram illustrating a method 1300 for fabricating a fin field effect transistor (FinFET) device according to an aspect of the present disclosure. In block 1302, a conformal amorphous or polycrystalline thin film of SiGe is deposited on the semiconductor fin. For example, as shown in FIG. 7, a thin film 700, which may be a conformal thin film, is deposited or otherwise coupled to the fin structures 104. In block 1304, the amorphous or polycrystalline thin film is oxidized to diffuse germanium from the amorphous or polycrystalline thin film into the semiconductor fin. For example, as shown in FIG. 8, an oxide 800 is formed. The oxide selectively removes the silicon from the thin film 700, while driving the germanium portion of the silicon-germanium into the fin structure 104 to create a SiGe fin 802. In block 1306, an oxidized portion of the amorphous or polycrystalline thin film is removed. For example, as shown in FIG. 9 the SiGe fin 802 is shown after the oxide 800 is removed.

According to a further aspect of the present disclosure, a fin field-effect transistor (FinFET) device on a substrate is described. In one configuration, the device includes means for conducting current, in which germanium from an amorphous or polycrystalline silicon-germanium (SiGe) thin film is diffused into the current conducting means. The current conducting means may be a fin structure 104 or SiGe fin 802 as described in FIG. 8, or other means. In another aspect, the aforementioned means may be any module or any apparatus configured to perform the functions recited by the aforementioned means.

Figure 14:
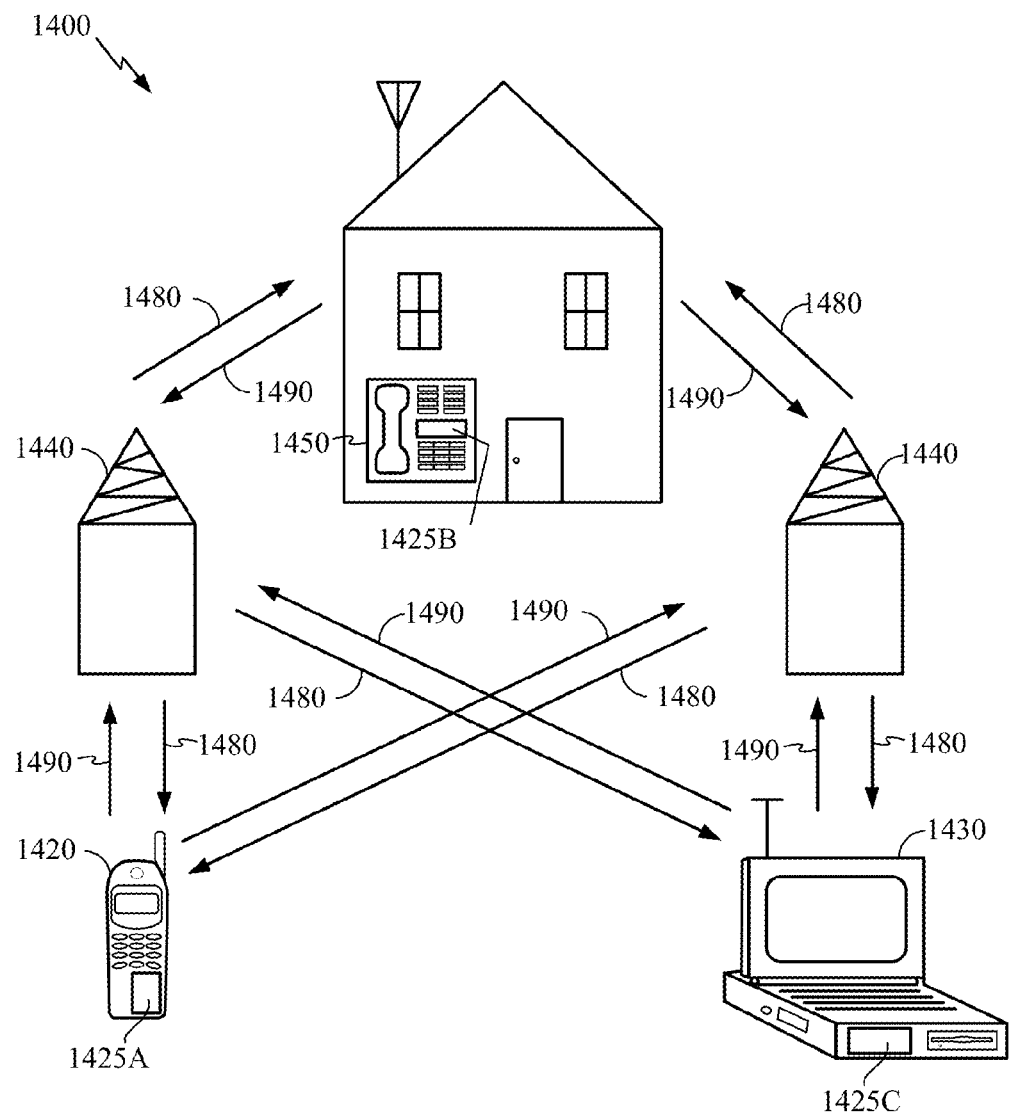
FIG. 14 is a block diagram showing an exemplary wireless communication system in which a configuration of the disclosure may be advantageously employed.

FIG. 14 is a block diagram showing an exemplary wireless communication system 1400 in which an aspect of the disclosure may be advantageously employed. For purposes of illustration, FIG. 14 shows three remote units 1420, 1430, and 1450 and two base stations 1440. It will be recognized that wireless communication systems may have many more remote units and base stations. Remote units 1420, 1430, and 1450 include IC devices 1425A, 1425C, and 1425B that include the disclosed devices. It will be recognized that other devices may also include the disclosed devices, such as the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base stations 1440.

In FIG. 14, remote unit 1420 is shown as a mobile telephone, remote unit 1430 is shown as a portable computer, and remote unit 1450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 14 illustrates remote units according to the aspects of the disclosure, the disclosure is not limited to these exemplary illustrated units. Aspects of the disclosure may be suitably employed in many devices, which include the disclosed devices.

Figure 15:
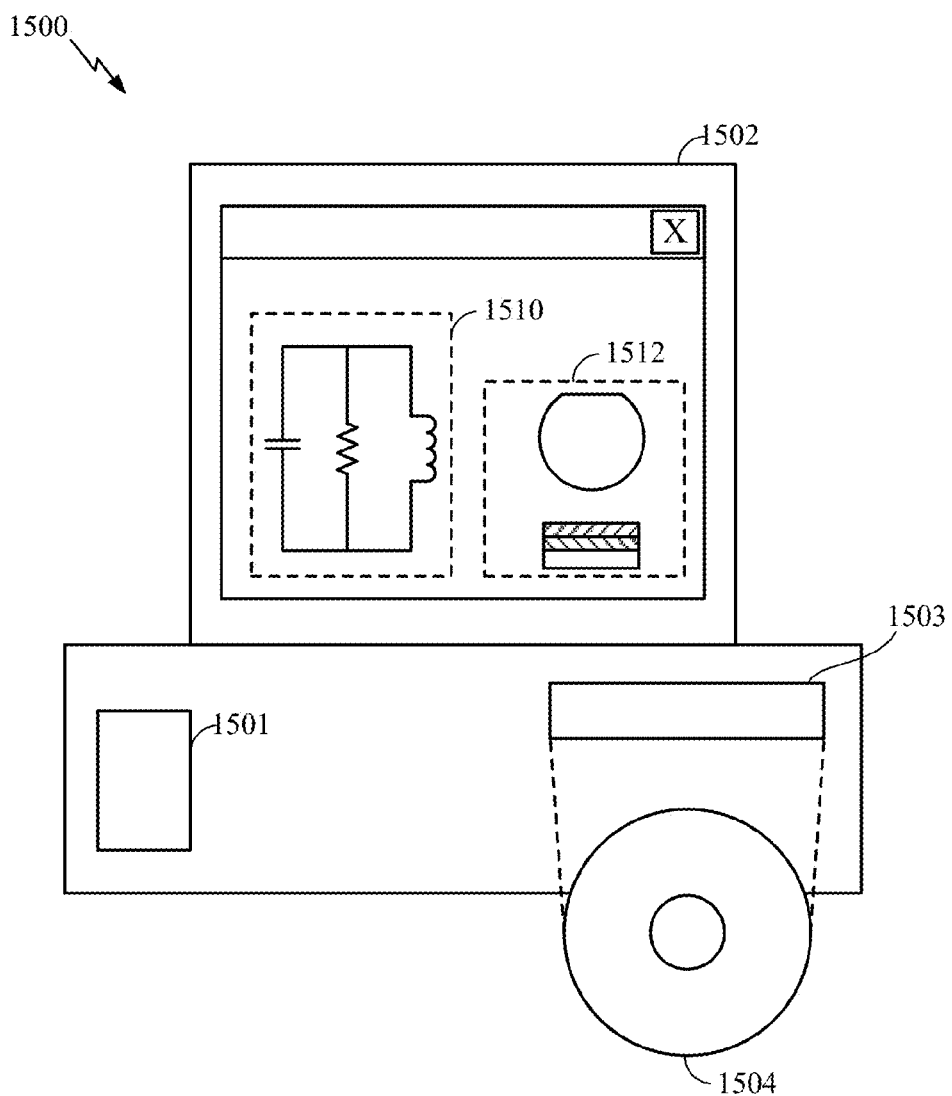
FIG. 15 is a block diagram illustrating a design workstation used for circuit, layout, and logic design of a semiconductor component according to one configuration.

FIG. 15 is a block diagram illustrating a design workstation used for circuit, layout, and logic design of a semiconductor component, such as the devices disclosed above. A design workstation 1500 includes a hard disk 1501 containing operating system software, support files, and design software such as Cadence or OrCAD. The design workstation 1500 also includes a display 1502 to facilitate design of a circuit 1510 or a semiconductor component 1512 such as a device in accordance with an aspect of the present disclosure. A storage medium 1504 is provided for tangibly storing the design of the circuit 1510 or the semiconductor component 1512. The design of the circuit 1510 or the semiconductor component 1512 may be stored on the storage medium 1504 in a file format such as GDSII or GERBER. The storage medium 1504 may be a CD-ROM, DVD, hard disk, flash memory, or other appropriate device. Furthermore, the design workstation 1500 includes a drive apparatus 1503 for accepting input from or writing output to the storage medium 1504.

Data recorded on the storage medium 1504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1504 facilitates the design of the circuit 1510 or the semiconductor component 1512 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of forming a semiconductor fin of a FinFET device, comprising:
conformally depositing an amorphous or polycrystalline thin film of silicon-germanium (SiGe) on the semiconductor fin;
oxidizing the amorphous or polycrystalline thin film to diffuse germanium from the amorphous or polycrystalline thin film into the semiconductor fin and into an interface between the semiconductor fin and a substrate supporting the semiconductor fin; and
removing an oxidized portion of the amorphous or polycrystalline thin film.

2. The method of claim 1, in which a compressive strain in the semiconductor fin is greater than in the substrate supporting the semiconductor fin.

3. The method of claim 2, in which the semiconductor fin is substantially in a same crystal orientation as a surface of the substrate.

4. The method of claim 3, in which the crystal orientation of the semiconductor fin is the same before oxidizing the amorphous or polycrystalline thin film as the crystal orientation of the semiconductor fin is after oxidizing the amorphous or polycrystalline thin film.

5. The method of claim 1, in which the semiconductor fin is substantially single crystalline.

6. The method of claim 1, in which the conformally depositing comprises a non-selective deposition on surfaces of a plurality of different materials.

7. The method of claim 6, further comprising etching the thin film to provide a SiGe spacer on the semiconductor fin.

8. The method of claim 7, in which the etching is anisotropic.

9. The method of claim 1, in which the conformally depositing comprises a selective deposition on surfaces of the semiconductor fin.

10. The method of claim 1, in which the semiconductor fin comprises silicon germanium or silicon.

11. The method of claim 1, further comprising diffusing germanium into a surface of the substrate supporting the semiconductor fin to provide the interface between the semiconductor fin and the substrate.

12. The method of claim 1, in which the FinFET device is integrated into a mobile phone, a set top box, a music player, a video player, an entertainment unit, a navigation device, a computer, a hand-held personal communication systems (PCS) unit, a portable data unit, and/or a fixed location data unit.

13. A fin field-effect transistor (FinFET) device on a substrate, comprising:
a semiconductor fin comprising a conformally deposited amorphous or polycrystalline silicon-germanium (SiGe) thin film, in which germanium from the amorphous or polycrystalline thin film is diffused into the semiconductor fin and into an interface between the semiconductor fin and the substrate.

14. The FinFET device of claim 13, in which a compressive strain in the semiconductor fin is greater than in the substrate supporting the semiconductor fin.

15. The FinFET device of claim 14, in which the semiconductor fin is substantially in a same crystal orientation as a surface of the substrate.

16. The FinFET device of claim 15, in which the crystal orientation of the semiconductor fin is the same before oxidizing the amorphous or polycrystalline thin film as the crystal orientation of the semiconductor fin is after oxidizing the amorphous or polycrystalline thin film.

17. The FinFET device of claim 13, in which the semiconductor fin is substantially single crystalline.

18. The FinFET device of claim 13, in which a SiGe portion of the semiconductor fin extends from a shallow trench isolation region of the substrate and a silicon portion of the semiconductor fin extends through the shallow trench isolation region of the substrate.

19. The FinFET device of claim 13, in which a surface of the substrate includes a portion of diffused germanium to provide the interface between the semiconductor fin and the substrate.

20. The FinFET device of claim 13, in which the semiconductor fin comprises silicon germanium or silicon.

21. The FinFET device of claim 13 integrated into a mobile phone, a set top box, a music player, a video player, an entertainment unit, a navigation device, a computer, a hand-held personal communication systems (PCS) unit, a portable data unit, and/or a fixed location data unit.

22. A method for forming a semiconductor fin of a FinFET device, comprising:
    the step for conformally depositing an amorphous or polycrystalline thin film of silicon-germanium (SiGe) on the semiconductor fin;
    the step for oxidizing the amorphous or polycrystalline thin film to diffuse germanium from the amorphous or polycrystalline thin film into the semiconductor fin and into an interface between the semiconductor fin and a substrate supporting the semiconductor fin; and
    the step for removing an oxidized portion of the amorphous or polycrystalline thin film.

23. The method of claim 22, in which the FinFET device is integrated into a mobile phone, a set top box, a music player, a video player, an entertainment unit, a navigation device, a computer, a hand-held personal communication systems (PCS) unit, a portable data unit, and/or a fixed location data unit.

24. A fin field-effect transistor (FinFET) device on a substrate, comprising:
    means for conducting current, in which germanium from an amorphous or polycrystalline silicon-germanium (SiGe) thin film is diffused into the current conducting means and into an interface between current conducting means and the substrate; and
    the substrate coupled to the current conducting means.

25. The FinFET device of claim 24, in which a compressive strain in the current conducting means is greater than in the substrate coupled to the current conducting means.

26. The FinFET device of claim 24, integrated into a mobile phone, a set top box, a music player, a video player, an entertainment unit, a navigation device, a computer, a hand-held personal communication systems (PCS) unit, a portable data unit, and/or a fixed location data unit.

* * * * *